(12) United States Patent
Linder

(10) Patent No.: US 7,774,714 B2
(45) Date of Patent: Aug. 10, 2010

(54) COMPUTER AIDED DESIGN SYSTEM HAVING BUSINESS PROCESS ATTRIBUTES

(75) Inventor: James D. Linder, Placentia, CA (US)

(73) Assignee: Siemens Product Lifecycle Management Software Inc., Plano, TX (US)

( * ) Notice: Subject to any disclaimer, the term of this patent is extended or adjusted under 35 U.S.C. 154(b) by 2346 days.

(21) Appl. No.: 10/034,491

(22) Filed: Dec. 27, 2001

(65) Prior Publication Data

US 2003/0122875 A1 Jul. 3, 2003

(51) Int. Cl.
*G06F 3/00* (2006.01)

(52) U.S. Cl. .................. 715/771; 715/764; 715/970; 715/702; 715/706; 345/420; 700/706; 706/919

(58) Field of Classification Search .............. 715/771, 715/970, 764, 702, 502; 345/420; 706/919
See application file for complete search history.

(56) References Cited

U.S. PATENT DOCUMENTS

| | | | | |
|---|---|---|---|---|
| 5,526,478 A | * | 6/1996 | Russell et al. ............... | 715/202 |
| 5,625,798 A | * | 4/1997 | Badders et al. ............... | 703/1 |
| 6,230,066 B1 | * | 5/2001 | Sferro et al. ............... | 700/104 |
| 6,295,513 B1 | * | 9/2001 | Thackston ............... | 703/1 |
| 6,611,725 B1 | * | 8/2003 | Harrison et al. ............... | 700/98 |
| 6,647,305 B1 | * | 11/2003 | Bigelow ............... | 700/97 |
| 2002/0026385 A1 | * | 2/2002 | McCloskey et al. ............... | 705/27 |
| 2003/0001891 A1 | * | 1/2003 | Keohane et al. ............... | 345/754 |
| 2003/0098862 A1 | * | 5/2003 | Hunt et al. ............... | 345/418 |
| 2005/0172260 A1 | * | 8/2005 | Eichstaedt et al. ............... | 717/104 |

* cited by examiner

*Primary Examiner*—Ryan F Pitaro
(74) *Attorney, Agent, or Firm*—Michael J. Wallace, Jr.

(57) ABSTRACT

A digital design system 10 is described which includes a user interface 12 that is used to interact with a digital data set 14. The digital model data set 14 is augmented by smart model attributes and business process attributes stored in data sets 16 and 18, respectively. Business process attributes data set 18 may include information associated with quality information, safety information, revision information, and information links to other data sets. A knowledge base data set engine 20 inferentially applies attributes to various features, components, and processes defined in the digital model data set 14.

23 Claims, 1 Drawing Sheet

COMPUTER AIDED DESIGN SYSTEM HAVING BUSINESS PROCESS ATTRIBUTES

TECHNICAL FIELD OF THE INVENTION

This invention relates generally to the field of data processing systems and more particularly to a computer aided design system which includes business process attributes.

BACKGROUND OF THE INVENTION

Computer aided design systems provide useful environments for designers of mechanical components to specify the physical characteristics and configurations of various components within complex assemblies. Sophisticated computer aided design systems have also been able to provide designers with the ability to specify other information related to the construction and testing of these components. For example, some sophisticated computer aided design systems allow for the designer to specify the type of material to be used to construct a particular component, the tolerance associated with various dimensions of the component, processing techniques to be used to manufacture the component and other characteristics associated with the manufacture, testing, or use of components of the assembly.

In this manner, the data set which is constructed using the computer aided design system not only specifies the form of the component, but also includes other information which is useful to the manufacturer or tester of the components which goes beyond merely the size and configuration of the assembly.

Although sophisticated systems have allowed other features of components to be specified and linked to structures within a data set, the systems have not typically allowed designers the freedom to specify information which is not associated with manufacture or testing of the component.

SUMMARY OF THE INVENTION

Accordingly, a need has arisen for a computer aided design system and method of operation that allows the linking and incorporation of business process attributes and other related information to a component data model created and manipulated using the computer aided design system.

In accordance with one embodiment of the present invention, a method of processing the data set associated with a computer aided design system is provided that comprises the steps of identifying a component feature within a digital model data set associated with an assembly to which the component feature is a member. Data representative of a business attribute associated with a component feature may also be stored such that the business attribute is linked to the component feature and may be retrieved when the portion of the data set associated with the component feature is accessed using a data processing system processing the data set associated with the assembly.

According to one specific embodiment of the present invention, the business process attributes can contain internet, extranet, or intranet resource location addresses that may be associated with best practice processes or information associated with the identified component. According to an alternate embodiment of the present invention, the business process attribute may comprise information associated with quality, safety or revision information that may be useful to parties accessing the data set associated with the assembly.

An important technical advantage of the present invention inheres in the fact that the ability to link business process attributes to the component data set allows persons utilizing the data set to have access to business and parametric information which may have been tracked using prior systems but was always accessible only through the use of unrelated systems or conventional sources of information.

BRIEF DESCRIPTION OF THE DRAWINGS

A more complete understanding of the present invention may be acquired by referring to the accompanied figures in which like reference numbers indicate like features and wherein.

DETAILED DESCRIPTION OF THE DRAWINGS

Figure 1:
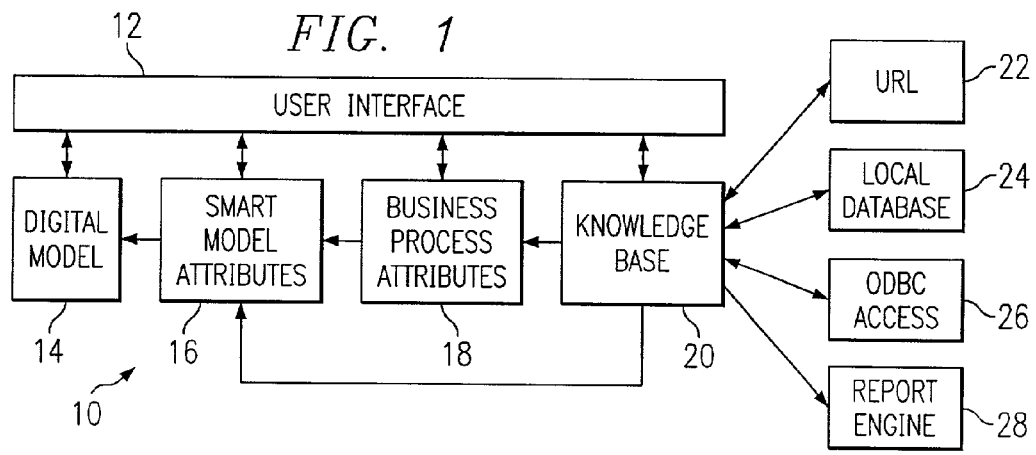
FIG. 1 is a schematic block diagram of the organization of the data structures which may be used in one embodiment of the present invention.

FIG. 1 is a block diagram of a design system 10 which utilizes a user interface 12 to access various data structures. User interface 12 interacts with a digital model data set 14, which comprises information which defines the physical structure of components of an assembly, for example, in a computer aided design environment. Digital model data set 14 may comprise data which specifies the size and orientation of various components within a more complex mechanical assembly. The digital model data set 14 receives and is linked to additional information from a smart model attribute data set 16. The smart model attribute data set 16 also interacts with user interface 12, as will be discussed herein. The smart model attribute data set 16 provides additional information which is linked to various features specified within the digital model data set 14. For example, the digital model data set 14 may comprise the dimensions and orientations of a particular bracket within a complex mechanical assembly. In this example, the smart model attribute data set 16 may comprise information associated with the type of material used to construct the bracket as well as tolerance information associated with the dimensions of the bracket and process information, such as, for example, heat treatments, finishes, specific coatings, lubricants or other processing used to construct the bracket. In this manner, not only is the size and orientation of the component bracket specified, but various information about how to construct the bracket is specified through the additional parameters of smart model attribute data set 16.

According to the teachings of the present invention, the system 10 may also include a business process attribute data set 18 which further augments the digital model data set 14. The business process attribute data set 18 comprises additional smart model attributes which are related to business processes associated with the components within the complex assembly. Although virtually any related information can be linked to the digital model data set 14 through the operation of business process attribute data set 18, the teachings of the present invention will be described with reference to several specific examples of business process attributes.

As examples only, the business process attribute stored within business process attribute data set 18 may comprise an information address field, a safety information field, a quality information field, or a revision information field. As will be discussed herein, each of these business process attributes fields can be linked to specific features within a component and can result in the display of valuable information to a user of the digital model data set 14 through the user interface 12. In general, the information address field provides for a link to an internet, intranet, extranet or other data set which may contain process or other information associated with the linked feature. The revision, safety and quality attributes allow a person manipulating digital model data set 14 to communicate with a user of the digital model data set 14 information that a particular feature is important to safety or quality or that a particular feature was changed during a particular revision cycle. This type of information can be very important to the tracking of quality or safety, or the testing or later redesign of particular components within an assembly.

Referring again to FIG. 1, the business process attribute data set 18 and the smart model attribute data set 16 are enhanced by being inferentially populated through the operation of a knowledge base data set engine 20. Knowledge base data set engine 20 receives information from uniform resource locators 22, local data bases 24, and external data bases that are accessed through an ODBC access port 26. The knowledge base data set engine 20 is also coupled to a report engine 28 which can provide spreadsheets or other reports associated with the data and information managed by knowledge base data set engine 20. In general, the knowledge base data set engine 20 retrieves information from the various sources identified and supplies them to either the smart model attribute data set 16 or the business process attribute data set 18 during the design of the digital model data set 14. For example, if a designer specifies that a particular bracket within an assembly is to be constructed using a particular type of steel, the knowledge base data set engine 20 could inferentially create and link a smart model attribute defining a particular heat treatment process that is required or suggested with that type of steel and could also inferentially create and link a business process attribute that any use of the required or suggested process indicates that the component is critical to quality and is a major safety concern. In this manner, a designer who may or may not know of the various structural and mechanical options available to him and the associated business processes can benefit from the information managed by the knowledge base data set engine 20 which will inferentially link structures designed in the digital model data set 14 during the design process to applicable smart model and business process attributes.

Figure 2:
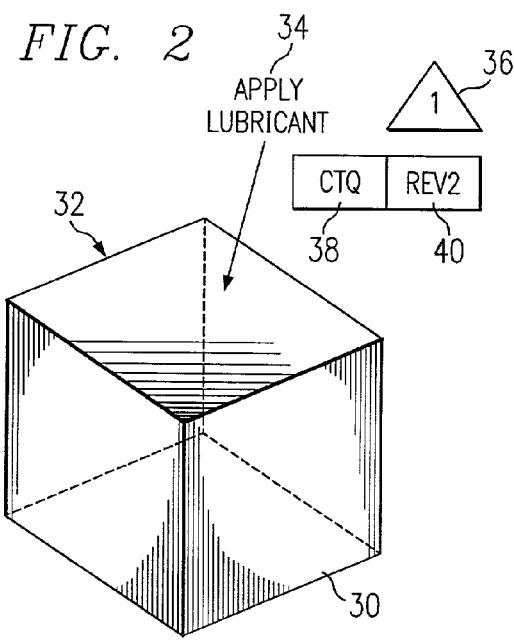
FIG. 2 is an illustrative display of a component with associated business process attributes processed in accordance with one embodiment of the present invention.

FIG. 2 represents an example of a display component which comprises various business process attribute links. Referring to FIG. 2, a component 30 comprises a surface 32. The component 30 and the surface 32 are represented by various digital information within digital model data set 14. The surface 32 and the data associated within digital model data set 14 is linked to a specific smart model attribute within smart model attribute data set 16 which specifies that during the construction of component 30, the surface 32 must have a lubricant applied to it. This is represented by smart model attribute display instance 34 shown in FIG. 2.

The smart model attribute display instance 34 and the data associated with it within smart model attribute data set 16 are also linked to several business process attributes stored within business process attribute data set 18. For example, the words "apply lubricant" shown in FIG. 2 may themselves comprise a hypertext link to an internet, intranet or extranet uniform resource locator (URL) address. When this address is activated by clicking on the words "apply lubricant," the user operating within user interface 12 will view a browser which will display the information stored at the address associated with the link. In this example, the URL identified could be associated with an address storing information defining the process used to apply the lubricant. In this manner, best practice information can be stored at a centrally accessible location and digital model data sets associated with that process can be automatically updated to include improved or otherwise changed processes. Accordingly, instead of specifying a lubricant and a process for applying the lubricant with a conventional smart model attribute associated with surface 32, a link to a central address is provided so that this process can change over time and the multiplicity of data models that incorporate the process through the information link can be improved or changed automatically without the need to distribute updated process information to any past user of the attribute.

Referring again to FIG. 2, the display instance 34 also includes a safety indicator indicated generally at 36. Surface 32 and, specifically, the process defining the application of lubricant to surface 32 has been identified in the example shown in FIG. 2 as being a critical safety concern. A safety business process attribute may have various values such as, for example, the attribute may be a "critical", "major", or "minor" concern to safety. The display element 36 shown in FIG. 2 illustrates one potential method of communicating this safety information to a user of the system. For example, a critical safety concern might result in a display of a 1 in a triangle, a major safety concern could result in the result of a 2 in a triangle and a minor safety concern could result in the display of a 3 in a triangle.

FIG. 2 also illustrates a quality information display indicator 38 and a revision display indicator 40 associated with surface 32. Quality information may comprise various levels of information such as, for example, information specifying that a particular process, feature, or element may be critical to quality, a key characteristic or of no concern to quality. These could be represented by quality display instances of "CTQ" for critical to quality, "KC" for key characteristic or be left blank if the feature or process is not a quality concern.

Similarly, the revision information associated with revision display indicator 40 may communicate a revision number or other identifier to a user of the system 10. In this manner, a user can be made to understand that a particular process or feature within the digital model data set 14 was changed during a particular revision. In the example shown in FIG. 2, the revision display indicator 40 specifies that surface 32 or its associated processes were changed in Revision 2.

Although the display shown in FIG. 2 includes business process attribute display instances 34, 36, 38 and 40, it should be understood that these attributes may or may not be displayed to a user. For example, in particular embodiments, it may be advantageous to include certain attributes in the data set 18 without actually creating display instances associated with these attributes but, rather, to merely use such attributes to populate reports or other data accumulations that allow a user to see listings or other compilations of attributes or the features to which they are associated. In this manner, a user may compile a report that identifies all features having a particular safety or quality level or all features that were affected in a particular revision.

The business process attributes shown with reference to FIG. 2 are very useful to a designer, manufacturer, or tester who is accessing the complete digital model data set 14 through user interface 12. In addition, the digital model data set 14 including the smart model attributes and business process attributes discussed previously can be accessed through various reporting engines without the use of graphical displays. For example, if a complex assembly had various components within it that were critical to quality or safety, a quality or safety program could use the business process attributes to identify and list the various critical components within the complex assembly. In this manner, the use of business process attributes can be a very convenient way to comply with safety or quality reporting needs associated with comprehensive, safety or quality management programs within an organization.

In addition, the business process attributes can be used to drive various testing requirements associated with the assembly. For example, the comprehensive, digital model data set 14 can be available to a tester of an assembly. Various tests processes can be linked to various levels identified by business process attributes. For example, a component which is identified as being critical to quality through the use of a quality information business process attribute may have a test regimen where every instance of that component must be tested. In contrast, a particular process or feature that is only a key characteristic as opposed to being a critical characteristic may result in a test regimen where only a sampling of half or fewer of the particular components are tested. In this manner, business process attributes can affect the way a component or assembly is manufactured, tested, stored or otherwise processed through interaction with the data processing system 10.

Figure 3:
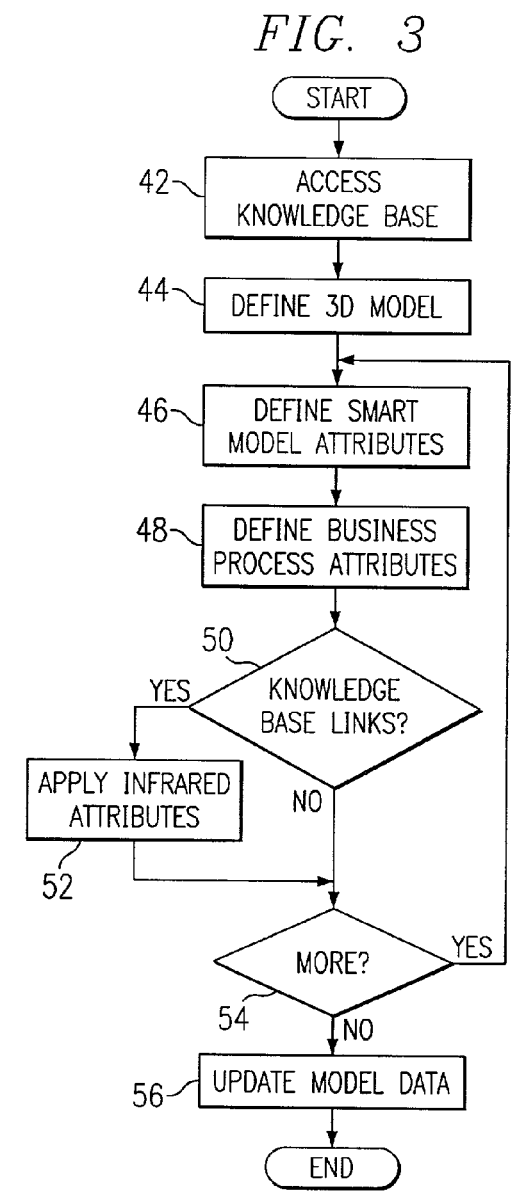
FIG. 3 is a flow diagram illustrating one method of processing design data according to the teachings of the present invention.

FIG. 3 is a flow chart which illustrates the way in which various attributes are applied and the way in which the knowledge base data set engine 20 can inferentially apply attributes to the digital model data set 14. The method shown in FIG. 3 begins at step 42 where the various resources available to the knowledge base data set engine 20 are accessed in response to the initiation of design activity using system 10. The method then proceeds to step 44 where the various features and attributes of components within an assembly are defined by user of system 10. The method then proceeds to step 46 where smart model attributes of features or components can be defined by the user. The method then proceeds to step 48 where business process attributes can be expressly defined by user of the system 10 by acting through user interface 12 and business process attribute data set 18. The method then proceeds to step 50 where the knowledge base data set engine 20 examines the various features, components, smart model attributes and business process attributes which have been expressly defined by the user. If any of these features, components or attributes are inferentially linked to data managed by knowledge base data set engine 20, the method proceeds to step 52 where inferential attributes are applied to the digital model data set 14 by the knowledge base data set engine 20. In this manner, a quality, safety, revision, or other information attribute can be automatically applied to a particular feature or component or process specified by a user system 10. In this manner, when a user of system 10 identifies a particular technique to be used to manufacture a component, the system 10 can automatically associate addresses of sites where best practice information associated with the process is concern. Further, the system can automatically identify the component as a safety or quality concern. Further, the system can automatically associate the component with a particular revision number associated with the design activity. In this manner, the system does not necessarily rely on the designer to remember to apply critical or convenient attributes to features specified within the digital model data set 14, but rather inferentially links various information and attributes to the model through the operation of an automated kmowledge base data set engine 20 accessing various data and process information. After the inferred attributes have been applied in step 52, the method proceeds to a decision point 54 where a determination is made as to whether or not more smart model or business process attributes are to be applied to the digital model data set 14. If no more attributes need be applied, the method proceeds to step 56 where the data set associated with the digital model data set 14 is updated and then the method ends. If more attributes are to be applied the method returns to step 46 where other smart model attributes, business process attributes and inferentially applied attributes can be identified and linked to the digital model data set.

Accordingly, a design system 10 has been described which allows for a designer to expressly link various quality, revisions, safety and other information to features, processes and other components within a digitally defined design model. In addition, an intelligent, automated, knowledge base can be applied to the data set through the use of inferentially applied attributes that are automatically linked to the digital model data set when particular features, materials, components or processes are selected by a user of the system.

The teachings of the present invention have been described with reference to specific attributes such as quality, safety, revision and other information. However, the teachings of the present invention should not be limited to these or any specific business process attributes. Other types of information and other specific attributes can be linked to features within a digital model data set without parting from the scope of the present invention. In general, although the present invention has been described with reference to specific embodiments, various changes, substitutions, alterations, modifications may be made to the teachings disclosed herein without departing from the scope of the present invention which is solely defined by the appending claims. To aid patent examining authorities and any readers of any patent issued on this application in interpreting the scope of the claims appended hereto, applicants wish to note that they (a) do not intend any of the appended claims to invoke paragraph 6 of 36 U.S.C. §112 as it exists on the date of filing hereof, unless the terms "means for" or "step for" are used in any particular claim; (b) do no intend any of the terms used in the claims to have a special meaning, but instead should all be construed to have their ordinary meaning to one of ordinary skill in the art, and (c) do not intend by any statement in the specification to limit the invention in any way that is not otherwise reflected in the claims.

What is claimed is:

1. A hardware data processing system, comprising:
a user interface operable to display information to a user and to receive commands from a user accessing a digital model data set;
a digital model data set comprising data associated with the form of mechanical structures; and
a business process attribute data set linked to the digital model data set such that various elements within the digital model data set are linked to business process attributes within the business process attribute data set such that users of the data processing system are displayed business process attribute display elements when a display element associated with a mechanical component defined by the digital model data set is displayed to the user by the hardware data processing system; and
wherein the business process attribute comprises one of:
quality information defining a quality level parameter associated with a component represented in the digital model data set;
safety information defining a safety level parameter associated with a component represented in the digital model data set;

revision information defining a revision parameter associated with a component represented in the digital model data set; and an information address attribute comprising a network address associated with information related to a component associated with data within the digital model data set.

2. The hardware data processing system of claim 1 wherein the business process attribute comprises quality information defining a quality level parameter associated with a component represented in the digital model data set.

3. The hardware data processing system of claim 1 wherein the business process attribute comprises revision information defining a revision parameter associated with a component represented in the digital model data set.

4. The hardware data processing system of claim 1 wherein the business process attribute comprises an information address attribute comprising a network address associated with information related to a component associated with data within the digital model data set.

5. The hardware data processing system of claim 4 wherein the information address attribute comprises a hypertext link address that when displayed to a user of the system and activated by the user of a system will result in the activation of a browser program which is operable to retrieve information stored at the information attribute hypertext link address.

6. The hardware data processing system of claim 1 and further comprising a knowledge base data set engine coupled to and operable to access various knowledge base data sets, the knowledge base data set engine operable to inferentially apply business process attributes to features within the digital model data set responsive to information linked to such features within the knowledge base data sets accessible to the knowledge base data set engine.

7. The hardware data processing system of claim 6 wherein the knowledge base data set engine is operable to automatically inferentially apply a quality information business process attribute to a feature included within the digital model data set.

8. The hardware data processing system of claim 6 wherein the knowledge base data set engine is operable to automatically inferentially apply a safety information business process attribute to a feature included within the digital model data set.

9. The hardware data processing system of claim 6 wherein the knowledge base data set engine is operable to automatically inferentially apply a revision information business process attribute to a feature included within the digital model data set.

10. The hardware data processing system of claim 6 wherein the knowledge base data set engine is operable to automatically inferentially apply an information address link attribute to a feature included within the digital model data set.

11. A method of operating a digital design system comprising:

defining digital model data set information specifying the structure of components within an assembly;

defining business process attributes linked to particular features specified within the digital model data set;

displaying instances of features within the digital model data set which are associated with such business process attributes;

displaying business process attribute display instances associated with business process attributes linked to the displayed features within the digital model data set when a display element associated with a mechanical component defined by the digital model data set is displayed to the user by the digital design system; and further comprising automatically inferentially applying business process attributes to features within the digital model data set through the operation of an automated knowledge base data set engine operable to store associations between potential features which may be used in digital model data sets and inferred business process attributes associated with such features.

12. The method of claim 11 wherein the business process attribute comprises a quality information attribute and wherein the business process attribute display instance specifies quality level information associated with the feature to which the quality information business attribute is linked.

13. The method of claim 11 wherein the business process attribute comprises a safety information attribute and wherein the business process attribute display instance specifies safety level information associated with the feature to which the safety information business attribute is linked.

14. The method of claim 11 wherein the business process attribute comprises a revision information attribute and wherein the business process attribute display instance specifies revision information associated with the feature to which the revision information business attribute is linked.

15. The method of claim 11 wherein the business process attribute comprises an information source link and wherein the business process attribute display instance is operable, when activated by a user, to access a network address at which information is stored that is associated with the feature to which the information source link is linked.

16. The hardware data processing system of claim 1 wherein the business process attribute comprises safety information defining a safety level parameter associated with a component represented in the digital model data set.

17. A hardware data processing system, comprising:

a user interface operable to display information to a user and to receive commands from a user accessing a digital model data set;

a digital model data set comprising data associated with the form of mechanical structures;

a business process attribute data set linked to the digital model data set such that various elements within the digital model data set are linked to business process attributes within the business process attribute data set such that users of the data processing system are displayed business process attribute display elements when a display element associated with a mechanical component defined by the digital model data set is displayed to the user by the hardware data processing system;

and wherein the business process attribute comprises safety information defining a safety level parameter associated with a component represented in the digital model data set.

18. A hardware data processing system, comprising:

a user interface operable to display information to a user and to receive commands from a user accessing a digital model data set;

a digital model data set comprising data associated with the form of mechanical structures;

a business process attribute data set linked to the digital model data set such that various elements within the digital model data set are linked to business process attributes within the business process attribute data set such that users of the data processing system are displayed business process attribute display elements when a display element associated with a mechanical component defined by the digital model data set is displayed to the user by the hardware data processing system; and a knowledge base data set engine coupled to and operable to access various knowledge base data sets, the knowledge base data set engine operable to inferentially apply business process attributes to features within the digital model data set responsive to information linked to such features within the knowledge base data sets accessible to the knowledge base data set engine.

19. The hardware data processing system of claim 18 wherein the business process attribute comprises quality information defining a quality level parameter associated with a component represented in the digital model data set.

20. The hardware data processing system of claim 18 wherein the business process attribute comprises safety information defining a safety level parameter associated with a component represented in the digital model data set.

21. The hardware data processing system of claim 18 wherein the business process attribute comprises revision information defining a revision parameter associated with a component represented in the digital model data set.

22. The hardware data processing system of claim 18 wherein the business process attribute comprises an information address attribute comprising a network address associated with information related to a component associated with data within the digital model data set.

23. The hardware data processing system of claim 22 wherein the information address attribute comprises a hypertext link address that when displayed to a user of the system and activated by the user of a system will result in the activation of a browser program which is operable to retrieve information stored at the information attribute hypertext link address.

* * * * *